United States Patent [19]

Nagai et al.

[11] Patent Number: 5,221,852

[45] Date of Patent: Jun. 22, 1993

[54] CHARGE COUPLED DEVICE AND METHOD OF PRODUCING THE SAME

[75] Inventors: Eiichi Nagai, Kawasaki; Tetsuo Nishikawa, Odawara, both of Japan

[73] Assignee: Fujitsu Limited, Kawasaki, Japan

[21] Appl. No.: 829,189

[22] Filed: Feb. 3, 1992

[30] Foreign Application Priority Data

Feb. 1, 1991 [JP] Japan .................................. 3-012307

[51] Int. Cl.⁵ ...................... H01L 29/78; H01L 27/02
[52] U.S. Cl. ..................................... 257/221; 257/250
[58] Field of Search ................. 357/24, 24 M, 24 LR; 377/62, 63; 257/221, 250

[56] References Cited

U.S. PATENT DOCUMENTS 5,103,278  4/1992  Miwada ................................ 357/24

FOREIGN PATENT DOCUMENTS

| | | | |
|---|---|---|---|
| 53-139475 | 5/1978 | Japan | 357/24 |
| 59-65470 | 4/1984 | Japan | 357/24 |
| 61-210670 | 9/1986 | Japan | 357/24 |
| 63-42170 | 2/1988 | Japan | 357/24 |
| 63-300561 | 12/1988 | Japan | 357/24 |

Primary Examiner—Andrew J. James
Assistant Examiner—Ngan Van Ngo
Attorney, Agent, or Firm—Staas & Halsey

[57] ABSTRACT

A charge coupled device (CCD) has a charge storage region and a potential barrier region. The CCD includes a first layer made of a first conductivity type semiconductor, a second layer made of a second conductivity type semiconductor and provided on the first layer, where the first and second conductivity types are mutually opposite types selected from n-type and p-type semiconductors, a third layer made of a first conductivity type semiconductor, impurity diffusion regions provided in at least a surface part of the third layer and having an impurity density higher than that of the third layer, a first gate electrode provided on the third layer between two mutually adjacent impurity diffusion regions, and a second gate electrode provided on each impurity diffusion region of the third layer. The impurity diffusion region forms the charge storage region of the CCD and the third layer between the two mutually adjacent impurity diffusion regions forms the potential barrier region of the CCD.

6 Claims, 5 Drawing Sheets

CHARGE COUPLED DEVICE AND METHOD OF PRODUCING THE SAME

BACKGROUND OF THE INVENTION

The present invention generally relates to charge coupled devices and methods of producing the same, and more particularly to a charge coupled device having an ion implanted region and a method of producing such a charge coupled device.

Recently, the integration density of charge coupled device (CCD) area sensors has been improved. For example, a CCD having 250,000 pixels for an ⅓ inch area is used for a video camera for home use, and video cameras for business (or professional) use are becoming smaller using a CCD having a large number of pixels. A CCD having 2,000,000 pixels is being developed for high definition televisions which are anticipated as media of the next generation. Therefore, there are demands to further reduce the size and further increase the number of pixels of the CCD, and in order to satisfy such demands, it is necessary to improve the integration density of the CCD channel part and ensure a sufficient charge transfer quantity.

The CCD transfers the charge which is stored in a potential well within a substrate, along the field. For example, the following steps are taken when forming a buried channel type CCD.

First, as shown in FIG. 1A, a p-type well 102 is formed in a silicon (Si) substrate 101, and an n-type impurity such as arsenic (As) and phosphor (P) is implanted into the p-type well 102 to make it active, that is, to form an n-type layer 103 having a uniform depth at the upper or surface part of the p-type well 102.

Next, as shown in FIG. 1B, A silicon dioxide (SiO$_2$) layer 104 and a polysilicon layer are successively formed on the n-type layer 103, and the polysilicon layer is patterned into a stripe pattern, for example, using a photolithography method. Each stripe of the patterned polysilicon layer is used as a first gate electrode 105.

Thereafter, the exposed portions of the SiO$_2$ layer 104 at the opposite sides of each gate electrode 105 are removed by etching, and a SiO$_2$ layer 107 is formed on the entire top surface of the stacked structure as shown in FIG. 1C. This SiO$_2$ layer 107 is used as an interlayer insulator.

Next, the gate electrode 105 is used as a mask to implant a p-type impurity such as boron (B) into the p-type well 102 and an annealing step is performed to make the impurity region active. As a result, an n$^-$-type diffusion layer 106 is formed in a region of the p-type well 102 between two adjacent first gate electrodes 105, as shown in FIG. 1C.

Finally, a second gate electrode 108 is formed on the interlayer insulator (SiO$_2$ layer) 107 between two adjacent first gate electrodes 105.

In this case, the gate length of the first gate electrode 105 is set greater than that of the second gate electrode 108. The n-type layer 103 under the first gate electrode 105 is used as a charge storage region, and the n$^-$-type diffusion layer 106 under the second gate electrode 108 is used as a barrier region.

Adjacent first and second gate electrodes 105 and 108 form a pair, and a 2-phase voltage, for example, is applied to the gate electrodes 105 and 108 of the adjacent pair so as to form a potential well under the gate electrodes 105 and 108. The charge is trapped and transferred using this potential well.

Although attempts have been made to reduce the size of the CCD, it is necessary to increase the quantity of charge which is transferred in order to maintain the same characteristic. In addition, the length of the n-type layer 103 under the first gate electrode 105 used as the charge storage region must be made as large as possible.

However, according to the conventional steps described above, B ions are implanted when forming the n$^-$-type diffusion layer 106, and this layer is made active by a thermal process. For this reason, the implanted B ions diffuse horizontally and narrow the n-type layer 103 which forms the charge storage region, and there is are problems in that the quantity of charge which can be transferred becomes small and the signal-to-noise (S/N) ratio becomes poor.

SUMMARY OF THE INVENTION

Accordingly, it is a general object of the present invention to provide a novel and useful charge coupled device and method of producing the same, in which the problems described above are eliminated.

Another and more specific object of the present invention is to provide a charge coupled device having a charge storage region and a potential barrier region, comprising a first layer made of a first conductivity type semiconductor, a second layer made of a second conductivity type semiconductor and provided on the first layer, where the first and second conductivity types are mutually opposite types selected from n-type and p-type semiconductors, a third layer made of a first conductivity type semiconductor, impurity diffusion regions provided in at least a surface part of the third layer and having an impurity density higher than that of the third layer, a first gate electrode provided on the third layer between two mutually adjacent impurity diffusion regions, and a second gate electrode provided on each impurity diffusion region of the third layer, where the impurity diffusion region forms the charge storage region of the charge coupled device and the third layer between the two mutually adjacent impurity diffusion regions forms the potential barrier region of the charge coupled device. According to the charge coupled device of the present invention, the impurity diffusion region (charge storage region) will not become narrower than the second gate electrode. Hence, it is possible to increase the quantity of charge which can be stored and improve the S/N ratio.

Still another object of the present invention is to provide a method of producing a charge coupled device having a charge storage region and a potential barrier region, comprising the steps of (a) forming a stacked structure made up of a first layer which is made of a first conductivity type semiconductor, a second layer which is made of a second conductivity type semiconductor and provided on the first layer, where the first and second conductivity types are mutually opposite types selected from n-type and p-type semiconductors, and a third layer made of a first conductivity type semiconductor, (b) forming impurity diffusion regions in at least a surface part of the third layer of the stacked structure, where the impurity diffusion regions have an impurity density higher than that of the third layer, (c) forming a first gate electrode on the third layer between two mutually adjacent impurity diffusion regions, and (d) forming a second gate electrode on each impurity diffusion region of the third layer, where the impurity diffusion region forms the charge storage region of the charge coupled device and the third layer between the two mutually adjacent impurity diffusion regions forms the potential barrier region of the charge coupled device. According to the method of the present invention, the impurity diffusion region (charge storage region) will not become narrower than the second gate electrode when ion implantation and annealing are used in the step (b). Hence, it is possible to produce a charge coupled device in which the quantity of charge which can be stored is large and the S/N ratio is improved.

Other objects and further features of the present invention will be apparent from the following detailed description when read in conjunction with the accompanying drawings.

DESCRIPTION OF THE PREFERRED EMBODIMENTS

A description will be given of a first embodiment of a method of producing a charge coupled device (CCD) according to the present invention, by referring to FIGS. 2A through 2G. This first embodiment of the method produces a first embodiment of a charge coupled device according to the present invention shown in FIG. 2G.

Figure 1A:
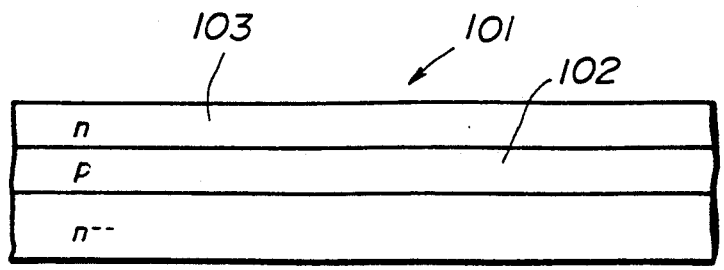
FIGS. 1A through 1D are cross sectional views for explaining an example of a conventional method of producing a charge coupled device.
Figure 1B:
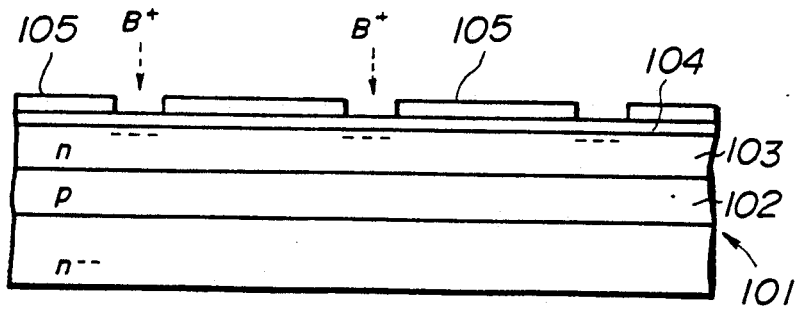
Figure 1C:
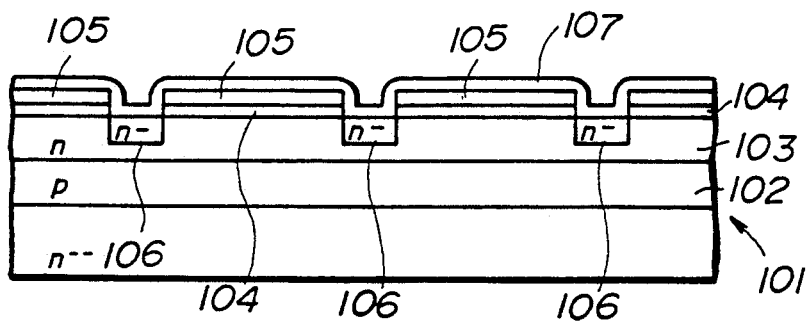
Figure 1D:
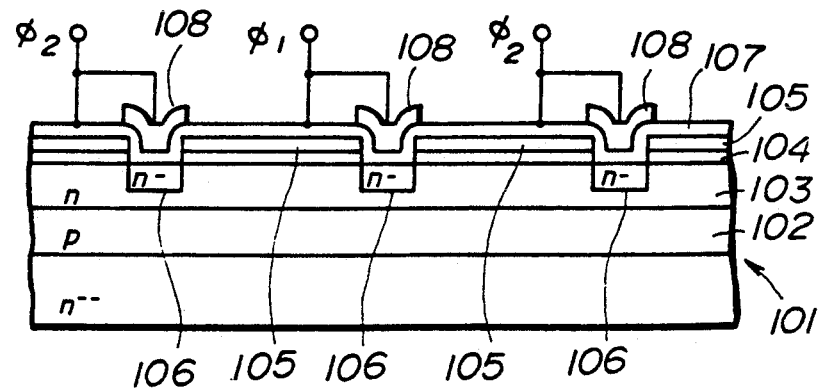
Figure 2A:
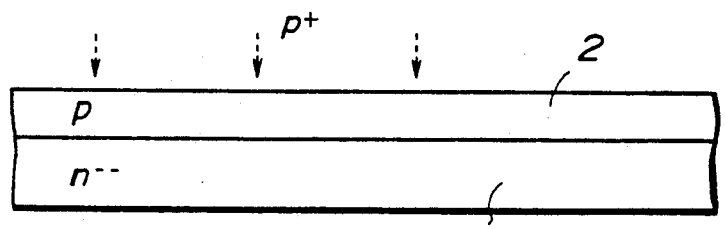
FIGS. 2A through 2G are cross sectional views for explaining a first embodiment of a method of producing a charge coupled device according to the present invention.
Figure 2B:
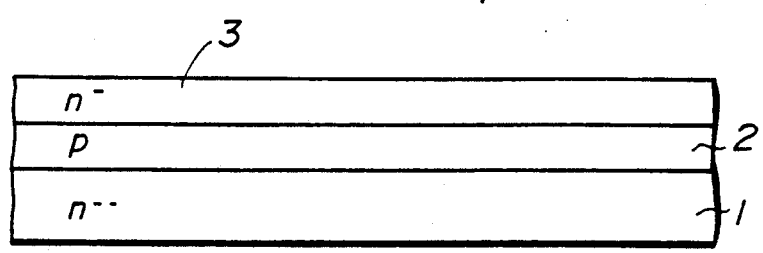

First, as shown in FIG. 2A, a p-type well 2 is formed in the upper part of an $n^{---}$-type Si substrate 1, and P ions are implanted into the p-type well 2 at an acceleration energy of 100 keV and a dosage of $2 \times 10^{12}/cm^2$. This n-type impurity region formed by the P ion implantation is made active by an annealing process at a temperature of 1050° C., so as to form an $n^{-}$-type layer 3 shown in FIG. 2B in the upper or surface part of the p-type well 2. This $n^{-}$-type layer 3 has a depth of approximately 5000 Å.

Figure 2C:
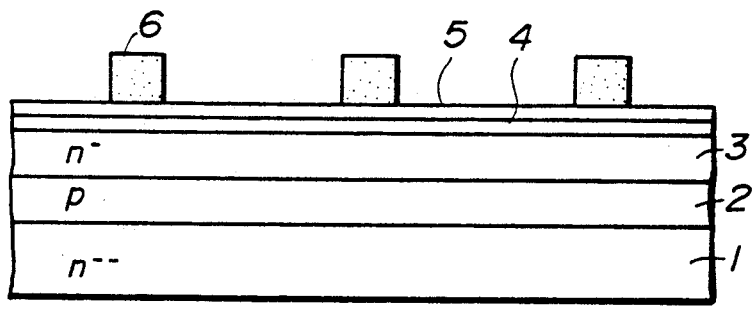

Next, a SiO$_2$ layer 4 is formed on the $n^{-}$-type layer 3 to a thickness of 500 Å, and a polysilicon layer 5 including an n-type impurity is formed on the SiO$_2$ layer 4 to a thickness of approximately 4000 Å by a chemical vapor deposition (CVD), as shown in FIG. 2C. A photoresist layer 6 is formed on the polysilicon layer 5, and this photoresist layer 6 is exposed and developed to form a stripe pattern. This stripe pattern has a plurality of stripes formed at intervals of 2 μm, where each stripe has a width of approximately 4 μm.

Figure 2D:
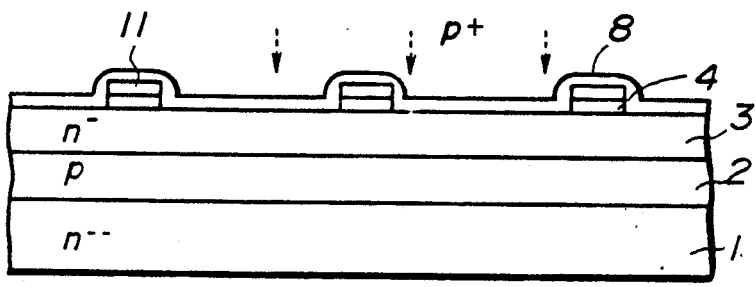

The polysilicon layer 5 which is not covered by the stripe pattern of the photoresist layer 6 and is exposed, is removed by a reactive ion etching. The photoresist layer 6 is subjected to an ashing process after the reactive ion etching. As a result, the shape of the photoresist layer 6 is transferred to the polysilicon layer 5. In other words, a stripe pattern of the polysilicon layer 5 is formed, and each stripe of this stripe pattern is used as a first gate electrode 11 shown in FIG. 2D. As shown in FIG. 2D, the SiO$_2$ layer 4 on both sides of each first gate electrode 11 is selectively removed by an etching, and a SiO$_2$ layer 8 is thereafter formed on the entire top surface of the stacked structure as shown in FIG. 2D.

Figure 2E:
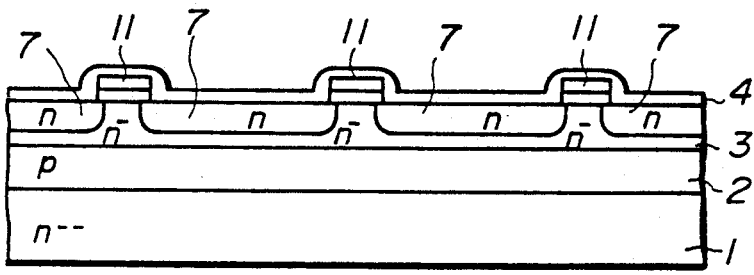

Next, the first gate electrode 11 is used as a mask, and P ions are implanted into the $n^{-}$-type layer 3 at an acceleration energy of 100 keV and a dosage of $1 \times 10^{12}/cm^2$. The implanted P is made active by a thermal process, and the impurity density of the region between two adjacent first gate electrodes 11 is set high so as to form an n-type diffusion layer 7 as shown in FIG. 2E.

Figure 2F:
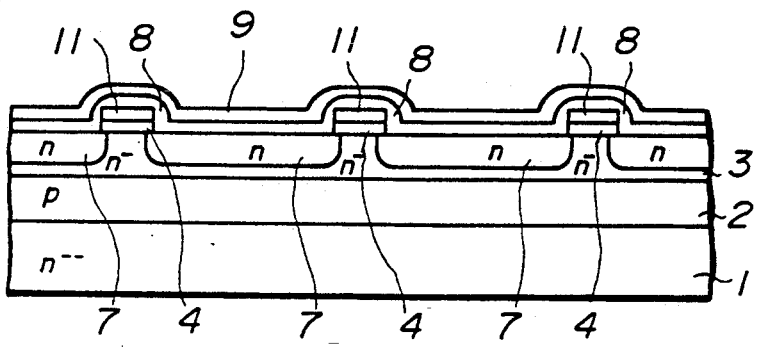
Figure 2G:
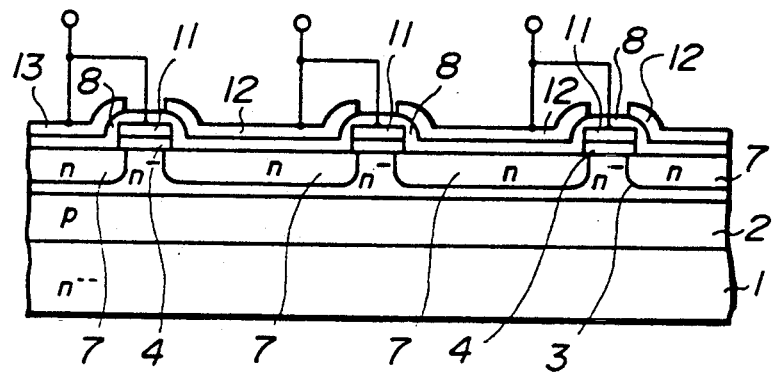

In addition, after forming a second polysilicon layer 9 which includes an impurity as shown in FIG. 2F, this polysilicon layer 9 is patterned so that the polysilicon layer 9 is removed in the region above the first gate electrode 11 and remains at least above the n-type diffusion layer 7, as shown in FIG. 2G. The remaining polysilicon layer 9 above the n-type diffusion layer 7 is used as a second gate electrode 12.

Therefore, the buried channel type charge coupled device is formed, and the gate length of the first gate electrode 11 of this charge coupled device is smaller than that of the second gate electrode 12. In addition, the n-type diffusion layer 7 under the second gate electrode 12 forms a charge storage region, while the $n^{-}$-type layer 3 between two adjacent n-type diffusion layers 7 forms a potential barrier region.

Voltages of the same phase are applied to the adjacent first and second gate electrodes 11 and 12, and multi-phase voltages are applied to each of the first gate electrodes when transferring the charge so as to form a channel in the bulk and to move the electrodes from the potential barrier region to the charge storage region, that is, towards the left in FIG. 2G.

According to this embodiment of the method, the n-type diffusion layer 7 which becomes the charge storage region will not become narrower than the second gate electrode 12 provided on top thereof. Rather, the n-type diffusion layer 7 diffuses into the $n^{-}$-type layer 3 under the first gate electrode 11 and spreads due to the thermal diffusion when the n-type diffusion layer 7 is formed. As a result, it is possible to positively guarantee a charge storage region having at least the same size as the second gate electrode 12, and the S/N ratio can be improved without reducing the quantity of the charge which can be stored.

In this embodiment, the $n^{-}$-type layer 3 is formed by ion implantation, but it is of course possible to grow the $n^{-}$-type layer 3 epitaxially.

In addition, although P ions are implanted into the Si substrate 1 when forming the $n^{-}$-type layer 3 and the n-type diffusion layer 7 in this embodiment, it is of course possible to implant other n-type impurity ions such as As ions.

In the embodiment described above, the n-type diffusion layer 7 is only formed to a predetermined depth within the $n^{-}$-type layer 3 and does not reach the interface between the $n^{-}$-type layer 3 and the p-type well 2 as shown in FIG. 2E. However, it is also possible to form the n-type diffusion layer 7 in the $n^{-}$-type layer 3 so as to reach the interface between the $n^{-}$-type layer 3 and the p-type well 2. Furthermore, the n-type diffusion layer 7 may partially extend into the p-type well 2.

Moreover, although the size (area) of the charge storage region is dependent on the process of forming the potential barrier region in the case of the conventional method, the size of the charge storage region of this first embodiment is dependent on the process of forming the charge storage region itself.

Figure 3A:
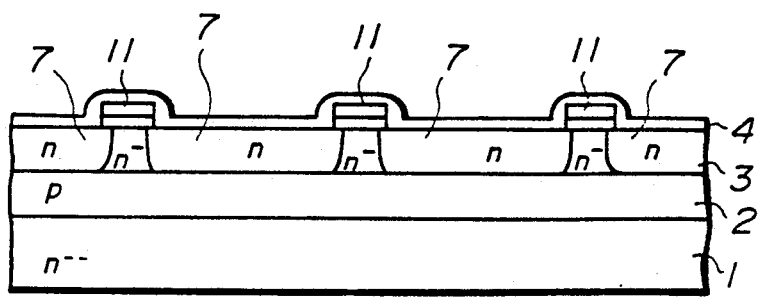
FIGS. 3A through 3C are cross sectional views for explaining a second embodiment of the method of producing the charge coupled device according to the present invention.
Figure 3B:
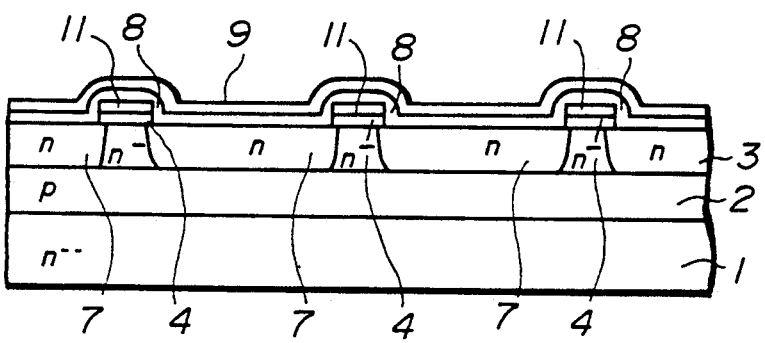
Figure 3C:
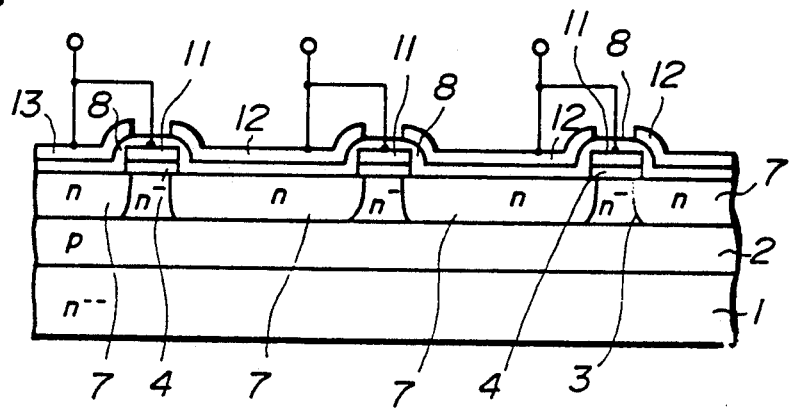

Next, a description will be given of a second embodiment of the method according to the present invention, by referring to FIGS. 3A through 3C. This second embodiment of the method produces a second embodiment of the charge coupled device according to the present invention shown in FIG. 3C. In FIGS. 3A through 3C, those parts which are the same as those corresponding parts in FIGS. 2A through 2G are designated by the same reference numerals, and a description thereof will be omitted.

According to this embodiment of the method, the processes are the same as those of the first embodiment of the method up to the steps described above in conjunction with FIGS. 2A through 2D. But thereafter, the n-type diffusion layer 7 is formed in the n$^-$-type layer 3 so as to reach the interface between the n$^-$-type layer 3 and the p-type well 2 as shown in FIG. 3A. Steps similar to those described in conjunction with FIGS. 2F and 2G are carried out as show in FIGS. 3B and 3C, thereby completing the second embodiment of the charge coupled device.

Figure 4A:
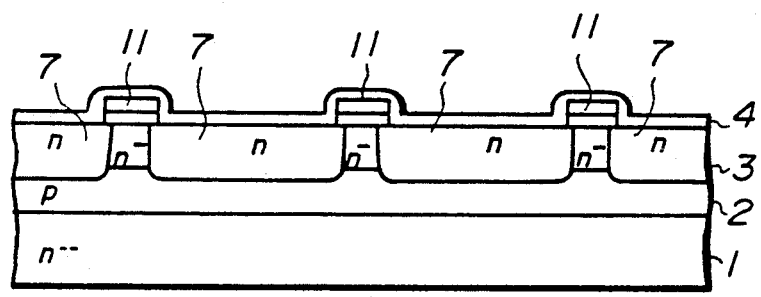
FIGS. 4A through 4C are cross sectional views for explaining a third embodiment of the method of producing the charge coupled device according to the present invention.
Figure 4B:
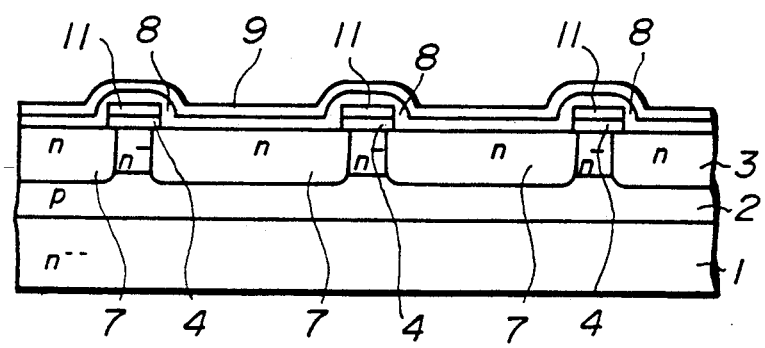
Figure 4C:
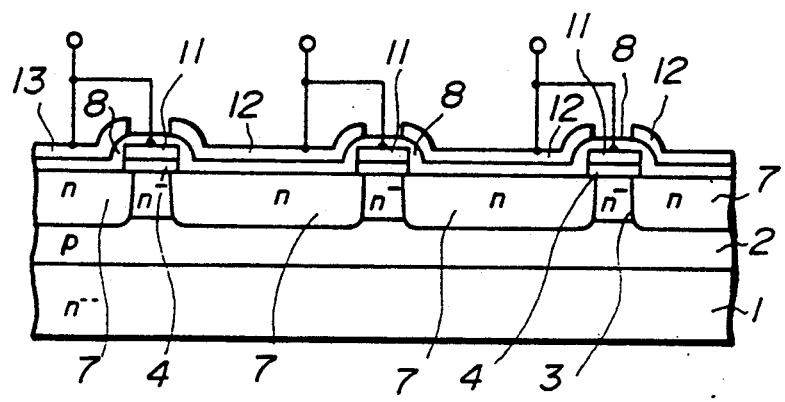

Next, a description will be given of a third embodiment of the method according to the present invention, by referring to FIGS. 4A through 4C. This embodiment of the method produces a third embodiment of the charge coupled device according to the present invention shown in FIG. 4C. In FIGS. 4A through 4C, those parts which are the same as those corresponding parts in FIGS. 2A through 2G are designated by the same reference numerals, and a description thereof will be omitted.

According to this embodiment of the method, the processes are the same as those of the first embodiment of the method up to the steps described above in conjunction with FIGS. 2A through 2D. But thereafter, the n-type diffusion layer 7 is formed in the n$^-$-type layer 3 so as to partially extend into the p-type well 2 as shown in FIG. 4A. Steps similar to those described in conjunction with FIGS. 2F and 2G are carried out, as shown in FIGS. 4B and 4C, thereby completing the third embodiment of the charge coupled device.

In the embodiments described above, the present invention is applied to the buried channel type charge coupled device. However, the present invention may similarly be applied to the surface channel type charge coupled device. In this case, when forming a charge storage region which has a low impurity density between the n-type (or p-type) potential barrier regions having the high impurity density, a p-type (or n-type) impurity is implanted into a semiconductor layer having a high impurity density and made active, so as to use a region with a low impurity density as the charge storage region.

Further, the present invention is not limited to these embodiments, but various variations and modifications may be made without departing from the scope of the present invention.

What is claimed is:

1. A charge coupled device comprising:
   a first layer made of a first conductivity type semiconductor;
   a second layer made of a second conductivity type semiconductor and provided on the first layer, said first and second conductivity types being mutually opposite types selected from n-type and p-type conductivity types;
   a third layer made of the first conductivity type semiconductor and provided on the second layer;
   impurity diffusion regions provided in spaced relationship in at least a surface part of the third layer, every two mutually adjacent, spaced impurity diffusion regions defining a corresponding portion of the third layer therebetween, the impurity diffusion regions having an impurity density higher than that of the third layer;
   a first gate electrode corresponding to and provided, in insulated relationship, on each portion of the third layer between two mutually adjacent, spaced impurity diffusion regions;
   a second gate electrode corresponding to and provided on each impurity diffusion region of the third layer;
   each said impurity diffusion region forming a corresponding charge storage region of the charge coupled device; and
   each portion of said third layer, between the two mutually adjacent and corresponding impurity diffusion regions, forming a respectively corresponding potential barrier region of the charge coupled device.

2. The charge coupled device as claimed in claim 1, wherein said impurity diffusion regions extend only partially within the third layer.

3. The charge coupled device as claimed in claim 1, wherein said impurity diffusion regions extend to an interface between the second and third layers.

4. The charge coupled device as claimed in claim 1, wherein said impurity diffusion regions penetrate through the third layer and extend partially into the second layer.

5. The charge coupled device as claimed in claim 1, wherein each said potential barrier region, between the two mutually adjacent and corresponding impurity diffusion regions, has a thickness identical to that of the third layer.

6. The charge coupled device as claimed in claim 1, wherein said first gate electrode is provided, in insulated relationship, on the corresponding portion of the third layer, and thus over the respectively corresponding potential barrier region, and covers a part of at least one of the corresponding and mutually adjacent impurity diffusion regions of the third layer.

* * * * *